(12) United States Patent
Kitahara et al.

(10) Patent No.: US 7,883,840 B2
(45) Date of Patent: Feb. 8, 2011

(54) DEVELOPING METHOD AND METHOD FOR FABRICATING SEMICONDUCTOR DEVICE USING THE DEVELOPING METHOD

(75) Inventors: Hidekazu Kitahara, Toyama (JP); Kenji Noda, Osaka (JP); Kenichi Asahi, Toyama (JP); Naohiko Ujimaru, Toyama (JP); Hirofumi Fukumoto, Toyama (JP)

(73) Assignee: Panasonic Corporation, Osaka (JP)

( * ) Notice: Subject to any disclaimer, the term of this patent is extended or adjusted under 35 U.S.C. 154(b) by 362 days.

(21) Appl. No.: 11/646,420

(22) Filed: Dec. 28, 2006

(65) Prior Publication Data

US 2007/0264007 A1    Nov. 15, 2007

(30) Foreign Application Priority Data

May 12, 2006    (JP)    ............................... 2006-133987

(51) Int. Cl.
*G03F 7/32*    (2006.01)
(52) U.S. Cl. ..................... 430/434; 430/322; 430/331
(58) Field of Classification Search ............. 430/270.1, 430/311, 331, 322
See application file for complete search history.

(56) References Cited

U.S. PATENT DOCUMENTS

| 5,626,913 A | * | 5/1997 | Tomoeda et al. ............. 427/299 |
| 5,897,982 A | * | 4/1999 | Shibata et al. ............... 430/311 |
| 6,033,134 A | * | 3/2000 | Maruyama et al. .......... 396/611 |
| 6,159,662 A | * | 12/2000 | Chen et al. .................... 430/313 |
| 6,372,413 B2 | * | 4/2002 | Ema et al. ..................... 430/326 |
| 2004/0043329 A1 | * | 3/2004 | Wu et al. ...................... 430/311 |

FOREIGN PATENT DOCUMENTS

JP    2003-7595 A    1/2003

* cited by examiner

*Primary Examiner*—Cynthia H Kelly
*Assistant Examiner*—Anca Eoff
(74) *Attorney, Agent, or Firm*—McDermott Will & Emery LLP

(57) ABSTRACT

In a developing method, a developer is supplied onto a resist film provided on a substrate, made of a resist and having an upper surface on which design patterns having different mask opening ratios are exposed and a development reaction is caused to proceed on the resist film with the supplied developer. After the development, the substrate is rotated so that the developer and the resist dissolved in the developer are removed. Then, a rinsing solution is supplied onto the resist film subjected to development and the substrate is rotated, thereby washing out the developer and the resist dissolved in the developer. The rotation speed of the substrate in removing the developer is a half or less of the rotation speed of the substrate in the rinsing step of washing out the resist.

12 Claims, 9 Drawing Sheets

FIG. 5A(1)
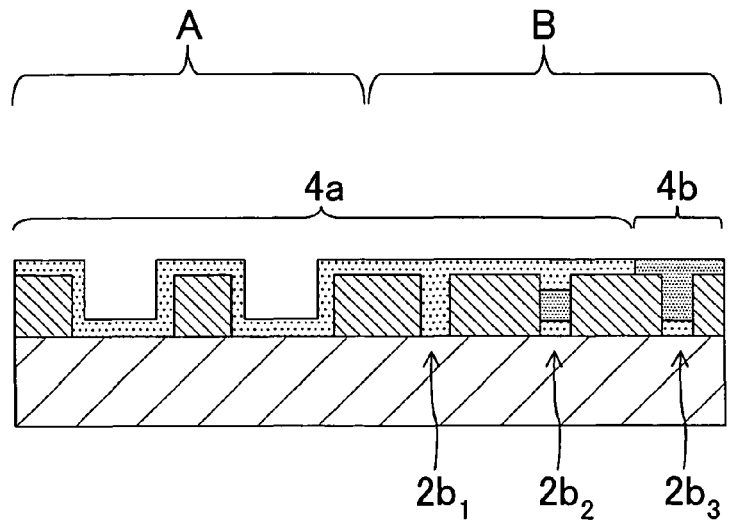
FIG. 5A(2)
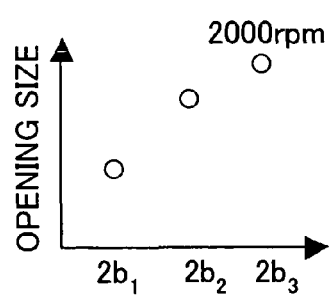
FIG. 5B(1)
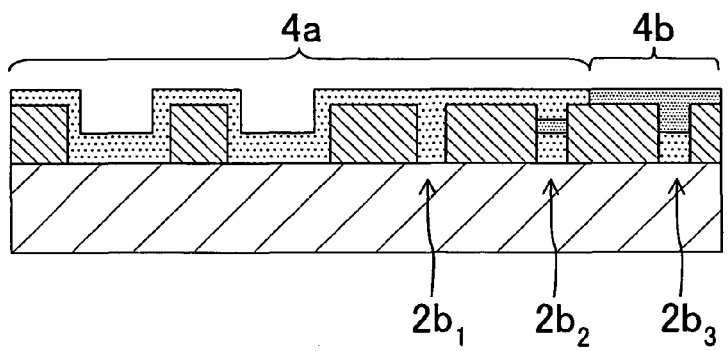
FIG. 5B(2)
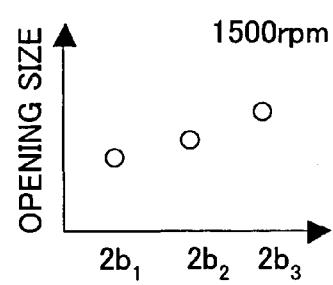
FIG. 5C(1)
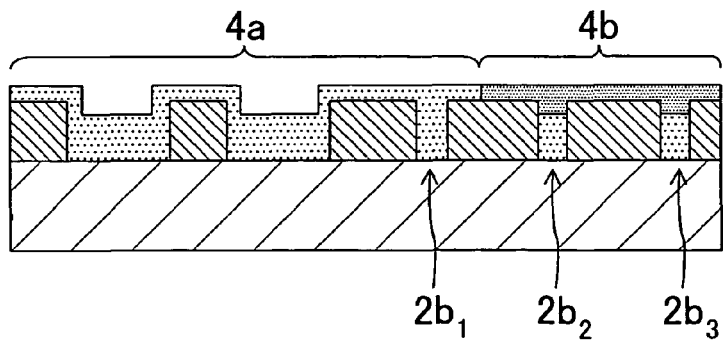
FIG. 5C(2)
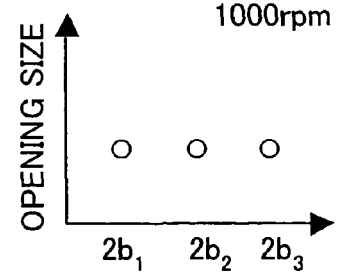

DEVELOPING METHOD AND METHOD FOR FABRICATING SEMICONDUCTOR DEVICE USING THE DEVELOPING METHOD

CROSS-REFERENCE TO RELATED APPLICATION

The disclosure of Japanese Patent Application No. 2006-133987 filed in Japan on May 12, 2006 including specification, drawings and claims is incorporated herein by reference in its entirety.

BACKGROUND OF THE INVENTION

The present invention relates to a method for developing a resist film for use in photolithography and a method for fabricating a semiconductor device using the developing method.

A photolithography process in conventional semiconductor fabrication includes: a process of applying a resist onto the principal surface of a semiconductor substrate (i.e., a wafer); an exposure process of burning a design pattern on the resist film; and a developing process of eluting a region exposed to light or a region not exposed to light so as to form a resist pattern.

A developing process generally uses a developing method in which a developer discharging nozzle supplies a developer from a given position onto the entire surface of a wafer with the wafer kept still or rotating. An example of such a method is a method of performing multi-stage development as disclosed in, for example, Japanese Unexamined Patent Publication No. 2003-7595 (hereinafter, referred to as Patent Literature).

In conventional multi-stage development, after a developing process, a developer is removed without the supply of a rinsing solution onto a wafer and then a developer is supplied again onto the wafer. This prevents generation of unwanted materials due to a concentration decrease of the developer caused by the rinsing solution after the first developing step and effectively eliminates unwanted materials with a developer which is supplied next.

The present inventors conducted various studies on a method for forming a resist pattern using conventional multi-stage development, to find the following problems. That is, in regions where resist patterns have different opening ratios, interaction of adjacent regions causes a size variation among openings. It is confirmed that this variation occurs especially in a region having a small opening ratio, e.g., a region where a contact hole is formed.

Specifically, as the size of semiconductor devices decreases, a demand for miniaturization in photolithography processes increases. In addition, various regions such as a memory region, a logic region and a pad electrode region are formed in a semiconductor chip. Resist patterns have different opening ratios among these regions, so that density variation occurs between the patterns. The opening ratio of a pattern herein is an area ratio of an opening with respect to a target region. Accordingly, a region where an opening having a large area per a unit area is formed, e.g., a region for an electrode pad, has a high opening ratio and a region where an opening having a small area per a unit area is formed, e.g., a region for contact holes, has a low opening ratio.

In particular, in a developing method in which a developer is applied onto a resist film in a still state, more specifically a developing method for developing a resist pattern using the multi-stage development disclosed in Patent Literature described above, it is necessary to rotate a wafer before a rinsing process for fling-off without drying a developer. Accordingly, the method is susceptible to the influence of density variation between patterns, resulting in a large variation in pattern size (which will be described later in detail).

SUMMARY OF THE INVENTION

It is therefore an object of the present invention to prevent a variation in pattern size (opening size) from occurring even when regions having different opening ratios are provided in a multi-stage developing method for a resist pattern.

To achieve the object, in a developing method according to the present invention, the rotation speed of a wafer in a developer removing step of removing a developer and a resist dissolved in the developer before a rinsing step is lower than that in the rinsing step or the rotation time of the wafer in removing a developer and a resist dissolved in the developer is shorter than that in the rinsing step.

With this method, the difference in concentration of developers due to a density variation between patterns in a wafer plane is reduced, so that the opening sizes in the wafer plane between resist patterns become uniform.

Specifically, a first developing method according to the present invention includes the steps of: a developer supplying step of supplying a developer onto a resist film provided on a substrate, made of a resist and having an upper surface on which design patterns having different mask opening ratios are exposed; a developing step of causing a development reaction to proceed on the resist film with the supplied developer; a developer removing step of rotating the substrate to remove the developer and the resist dissolved in the developer, after the developing step; and a rinsing step of supplying a rinsing solution onto the resist film subjected to development and rotating the substrate to wash out the developer and the resist dissolved in the developer, after the developer removing step, wherein the rotation speed of the substrate in the developer removing step is a half or less of the rotation speed of the substrate in the rinsing step.

In a conventional method, since the rotation speed is substantially equal to that in the rinsing step, a developer which is supplied onto a first region having a relatively low opening ratio and in which a resist is dissolved is flung off from an opening pattern. In addition, a larger amount of a developer which is supplied onto a second region having a relatively high opening ratio and in which the resist is dissolved flows into portions as the distance from the first region decreases. Accordingly, the degree of freshness (i.e., concentration) of a developer remaining in the opening pattern in the first region having a relatively low opening ratio varies depending on the location. However, according to the present invention, the rotation speed of the substrate in the developer removing step is one half or less of that in the rinsing step, so that the developer is not flung off from the opening pattern in the first region having a relatively low opening ratio. Accordingly, the degree of freshness of the developer remaining in the opening pattern in the first region does not vary depending on the location, so that a variation in pattern size among opening patterns is prevented.

In the first developing method, in the developer supplying step, the developer is preferably supplied with the substrate kept still.

A second developing method according to the present invention includes the steps of: a first developer supplying step of supplying a first developer onto a resist film, provided on a substrate, made of a resist and having an upper surface on which design patterns having different mask opening ratios are exposed; a first developing step of causing a development reaction to proceed on the resist film with the supplied first developer; a first developer removing step of rotating the substrate to remove the first developer and the resist dissolved in the first developer, after the first developing step; a second developer supplying step of supplying a second developer onto the resist film subjected to development, after the first developer removing step; a second developing step of causing a development reaction to proceed on the resist film with the supplied second developer; and a rinsing step of supplying a rinsing solution onto the resist film subjected to development and rotating the substrate to wash out the second developer and the resist dissolved in the second developer, after the second developing step, wherein the rotation speed of the substrate in the first developer removing step is a half or less of the rotation speed of the substrate in the rinsing step.

A third developing method according to the present invention includes the steps of: a first developer supplying step of supplying a first developer onto a resist film provided on a substrate, made of a resist and having an upper surface on which design patterns having different mask opening ratios are exposed; a first developing step of causing a development reaction to proceed on the resist film with the supplied first developer; a first developer removing step of rotating the substrate to remove the first developer and the resist dissolved in the first developer, after the first developing step; a second developer supplying step of supplying a second developer onto the resist film subjected to development, after the first developer removing step; a second developing step of causing a development reaction to proceed on the resist film with the supplied second developer; and a rinsing step of supplying a rinsing solution onto the resist film subjected to development and rotating the substrate to wash out the second developer and the resist dissolved in the second developer, after the second developing step, wherein the rotation time of the substrate in the first developer removing step is shorter than the rotation time of the substrate in the rinsing step.

In the third developing method, the rotation time of the substrate in the first developer removing step is shorter than that in the rinsing step, so that a developer is not flung off from the opening pattern in a region having a relatively low opening ratio. Accordingly, the degree of freshness of the developer remaining in the opening pattern in the region having a relatively low opening ratio does not vary depending on the location, so that a variation in pattern size among opening patterns is prevented.

In the second or third developing method, the resist film subjected to development is preferably kept not to be dried between the first developer removing step and the second developer supplying step.

In the second or third developing method, a series of the second developer supplying step, the second developing step and the rinsing step is preferably performed at lest twice.

In the second or third developing method, in the first developer supplying step, the first developer is preferably supplied with the substrate kept still.

In the second or third developing method, in the first developing step, the development reaction preferably proceeds with the substrate kept still.

In the second or third developing method, the rotation speed of the substrate in the first developer removing step is preferably one third or less of the rotation speed of the substrate in the rinsing step.

In the second or third developing method, the rotation speed of the substrate in the first developer removing step is preferably 1500 rpm or less.

A first method for fabricating a semiconductor device according to the present invention includes the steps of: forming a transistor on a substrate; forming a first insulating film on the substrate on which the transistor is formed; forming an interconnection on the first insulating film; forming a second insulating film on the first insulating film so that the interconnection is covered with the second insulating film; and forming, in the second insulating film, a first opening region for forming an electrode pad and a second opening region for forming a contact hole, the second opening region being adjacent to the first opening region and having a mask opening ratio lower than that of the first opening region, wherein the step of forming the first opening region and the second opening region includes an exposing step of applying a resist film made of a resist onto the second insulating film and exposing a pattern having the first opening region and the second opening region on the resist film, and a developing step of performing development on the resist film subjected to the pattern exposure, the developing step further includes a developer supplying step of supplying a developer onto the resist film, a development-reaction proceeding step of causing a development reaction to proceed on the resist film with the supplied developer, a developer removing step of rotating the substrate to remove the developer and the resist dissolved in the developer, after the development-reaction proceeding step, and a rinsing step of supplying a rinsing solution onto the resist film subjected to development and rotating the substrate to wash out the developer and the resist dissolved in the developer, after the developer removing step, and the rotation speed of the substrate in the developer removing step is one half or less of the rotation speed of the substrate in the rinsing step.

A second method for fabricating a semiconductor device according to the present invention includes the steps of: forming a transistor on a substrate; forming a first insulating film on the substrate on which the transistor is formed; forming an interconnection on the first insulating film; forming a second insulating film on the first insulating film so that the interconnection is covered with the second insulating film; and forming, in the second insulating film, a first opening region for forming an electrode pad and a second opening region for forming a contact hole, the second opening region being adjacent to the first opening region and having a mask opening ratio lower than that of the first opening region, wherein the step of forming the first opening region and the second opening region includes an exposing step of applying a resist film made of a resist onto the second insulating film and exposing a pattern having the first opening region and the second opening region on the resist film, and a developing step of performing development on the resist film subjected to the pattern exposure, the developing step further includes a first developer supplying step of supplying a first developer onto the resist film, a first development-reaction proceeding step of causing a development reaction to proceed on the resist film with the supplied first developer, a first developer removing step of rotating the substrate to remove the first developer and the resist dissolved in the first developer, after the first development-reaction proceeding step, a second developer supplying step of supplying a second developer onto the resist film subjected to development, after the first developer removing step, a second development-reaction proceeding step of causing a development reaction to proceed on the resist film with the supplied second developer, and a rinsing step of supplying a rinsing solution onto the resist film subjected to development and rotating the substrate to wash out the second developer and the resist dissolved in the second developer, after the second development-reaction proceeding step, and the rotation speed of the substrate in the first developer removing step is one half or less of the rotation speed of the substrate in the rinsing step.

In the first or second method, the first opening region preferably has a mask opening ratio of 20% or more and the second opening region has a mask opening ratio of 5% or less.

In the first or second method, the distance between the first opening region and the second opening region is preferably 1 mm or less.

BRIEF DESCRIPTION OF THE DRAWINGS

FIG. 3A is a plan view and FIG. 3B is a cross-sectional view taken along the line IIIb-IIIb in FIG. 3A.

FIG. 5A(1) is a cross-sectional view schematically showing a behavior of a developer in a case where high-speed rotation is used in a developer flinging off step before a rinsing step.

FIG. 5A(2) is a graph showing a relationship between the position of a region where contact holes are formed and the opening size in the case of FIG. 5A(1).

FIG. 5B(1) is a cross-sectional view schematically showing a behavior of a developer in a case where medium-speed rotation is used in the developer flinging off step before the rinsing step.

FIG. 5B(2) is a graph showing a relationship between the position of a region where contact holes are formed and the opening size in the case of FIG. 5B(1).

FIG. 5C(1) shows the case of the first embodiment and is a cross-sectional view schematically showing a behavior of a developer in a case where low-speed rotation is used in the developer flinging off step before the rinsing step.

FIG. 5C(2) is a graph showing a relationship between the position of a region where contact holes are formed and the opening size in the case of FIG. 5C(1).

DETAILED DESCRIPTION OF THE INVENTION

A developing method according to the present invention is a multi-stage developing method in which a developer is supplied with a wafer kept still. In this method, the rotation speed or time of a wafer for flinging off a developer in removing the developer and a resist dissolved in the solution by rotating the wafer is reduced so as to prevent a size variation among opening patterns caused by a density variation between patterns after development, i.e., a variation among regions having different opening ratios. Hereinafter, a method for setting the rotation speed in flinging off a developer lower than that in a rinsing step is disclosed in a first embodiment, and a method for setting the rotation time for flinging off a developer shorter than that in a rinsing step is disclosed in a second embodiment.

Embodiment 1

A first embodiment of the present invention will be described with reference to the drawings.

Figure 1:
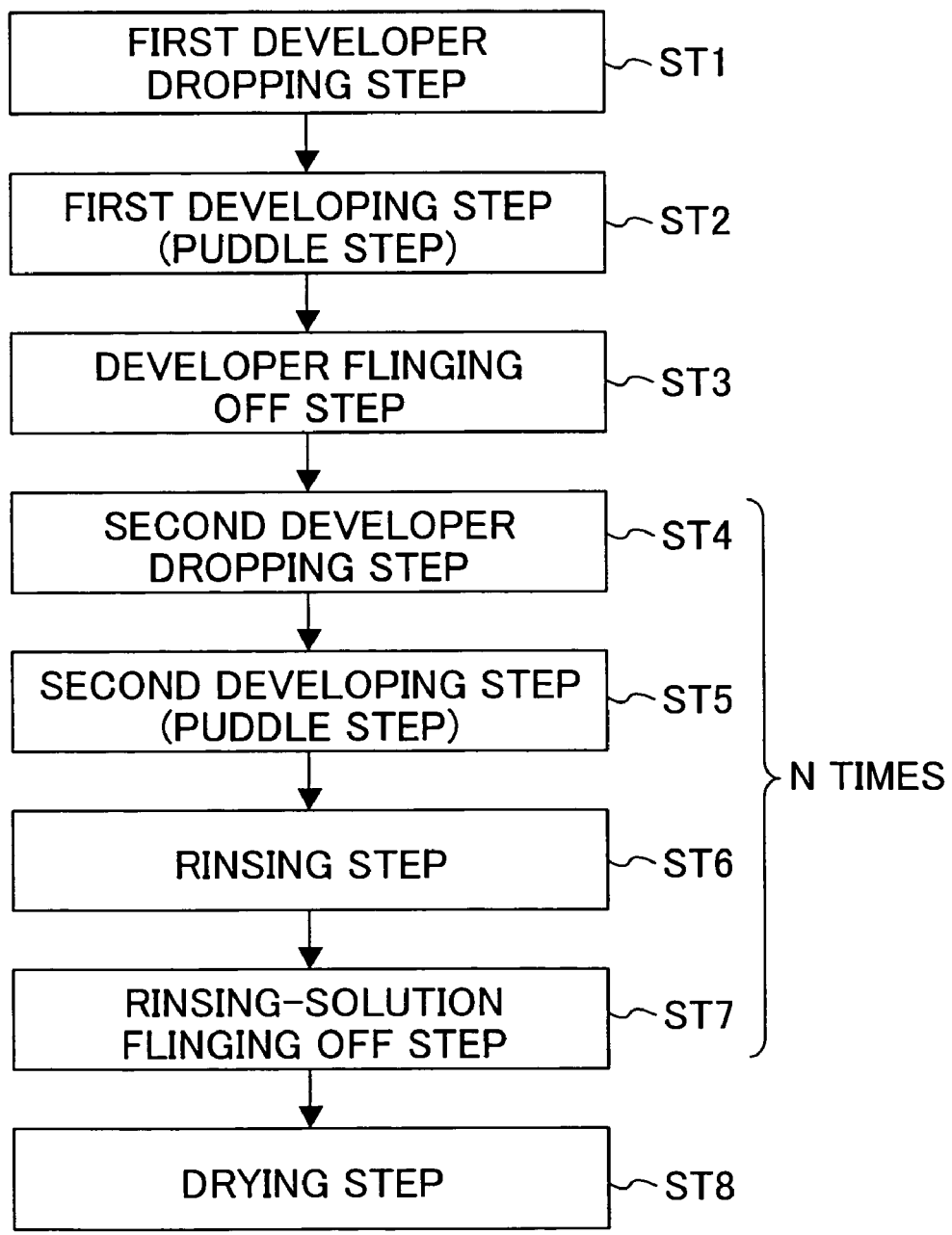
FIG. 1 is a flow chart showing processes of a developing method according to a first embodiment of the present invention.

FIG. 1 shows a flow of processes in a method for developing a resist according to the first embodiment. FIGS. 2A through 2G are side views schematically showing a method for developing a resist according to the process flow shown in FIG. 1.

In the first embodiment, so-called multi-stage development is performed. Specifically, a developer is supplied onto a resist film, and then a wafer is rotated without addition of a rinsing solution (pure water) so as to fling off and remove the developer. Thereafter, a developer is supplied onto the resist film again to perform second development. When necessary, third development is performed.

First, though not shown, the principal surface of the wafer having a diameter of, for example, 20.3 cm (i.e., 8 inches) and made of silicon (Si) is coated with a resist film by a spin coating process.

Figure 3A:
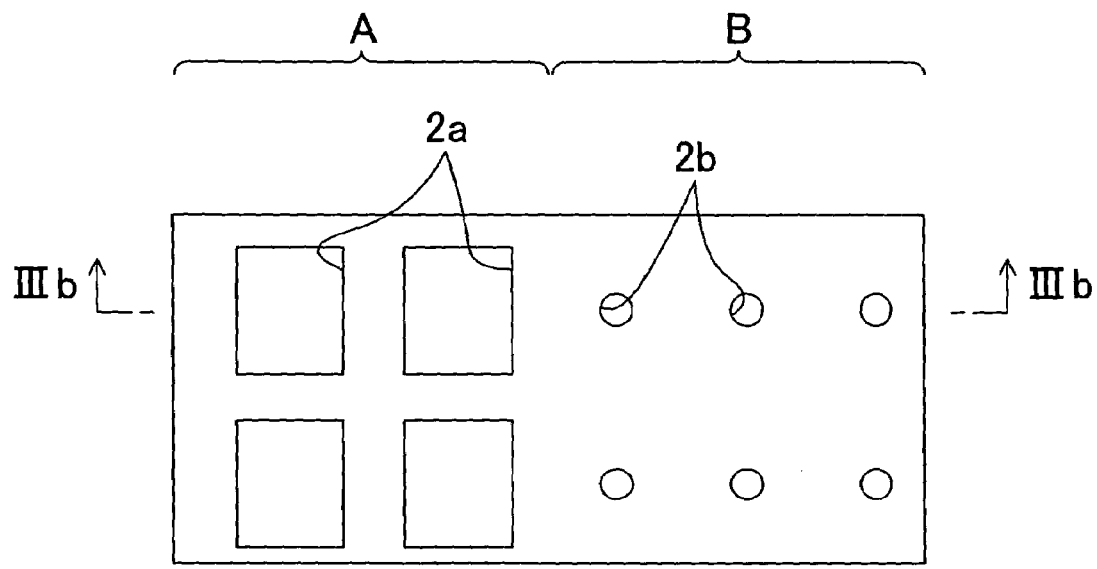
FIGS. 3A and 3B show a developing process of a resist according to the first embodiment.

Next, a design pattern including a pattern illustrated in FIG. 3A is exposed on the resist film. As illustrated in FIG. 3A, in the design pattern, a first region A including, for example, a plurality of electrode pad regions 2a and a second region B including a plurality of contact hole regions 2b are adjacent to each other. As an example, the opening ratio of the first region A is 60% and the opening ratio of the second region B is 3% in a resist film 2. The distance between one of the electrode pad regions 2a in the first region A and the closest one of the contact hole regions 2b in the second region B is set at 1 mm or less.

Figure 2A:
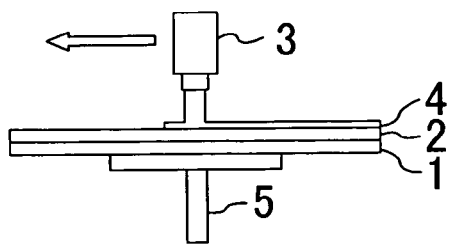
FIGS. 2A through 2G are side views schematically showing respective process steps of the developing method of the first embodiment.

Then, in a first developer dropping step ST1 shown in FIG. 1, a wafer 1 is held by a spin chuck 5, as illustrated in FIG. 2A. Thereafter, a developer discharging nozzle 3 discharging a developer 4 is moved over the principal surface of the wafer 1, thereby supplying the developer 4 onto the resist film 2 subjected to exposure. At this time, the wafer 1 is standing still.

Figure 2B:
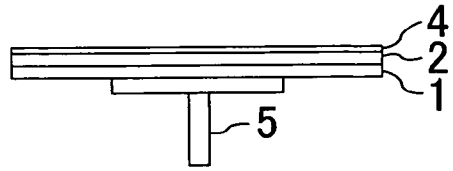

Thereafter, in a first developing step ST2 shown in FIG. 1, as illustrated in FIG. 2B, the developer 4 spread over the upper surface of the resist film 2 is held in a puddle state by the surface tension with the wafer 1 kept still. In this puddle state, development reaction with the developer 4 proceeds on the resist film 2.

Figure 2C:
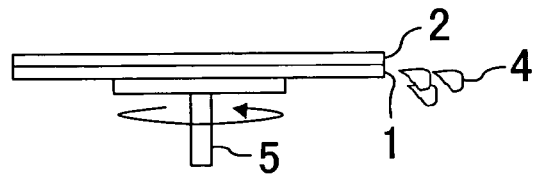

Subsequently, in a developer flinging off (i.e., developer removing) step ST3 shown in FIG. 1, the wafer 1 is rotated so as to fling off the developer 4 as illustrated in FIG. 2C. Though the developer 4 is flung off, the rotation speed and time are selected so as not to dry the surfaces of the wafer 1 and the resist film 2. A feature of the first embodiment is that the rotation speed of the wafer 1 in flinging off the developer 4 is set lower than that in a subsequent rinsing step. At this time, the rotation speed of the wafer 1 is, for example, 1000 rpm and the rotation time is 1.5 seconds.

Figure 2D:
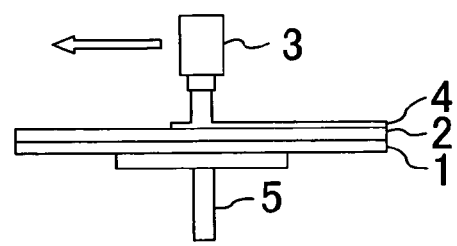

Then, in a second developer dropping step ST4 shown in FIG. 1, the developer discharging nozzle 3 discharging a developer 4 is moved over the wafer 1, thereby supplying the developer 4 again onto the resist film 2 on which developing reaction has proceeded, as illustrated in FIG. 2D. At this time, the wafer 1 is standing still.

Figure 2E:
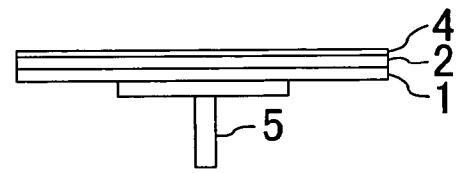

Thereafter, in a second developing step ST5 shown in FIG. 1, as illustrated in FIG. 2E, the wafer 1 is kept still in a puddle state and the development reaction on the resist film 2 with the developer 4 further proceeds.

Figure 2F:
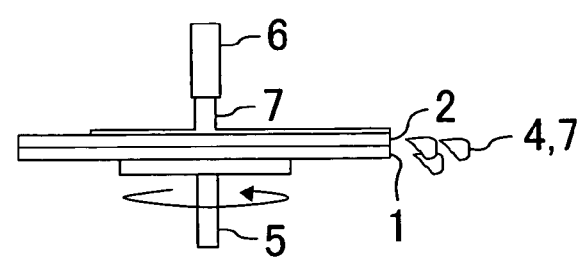

Subsequently, in a rinsing step ST6 and a rinsing-solution flinging off step ST7 shown in FIG. 1, as illustrated in FIG. 2F, the wafer 1 is rotated with a rinsing solution (pure wafer) 7 supplied onto the resist film 2 from a rinsing-solution discharging nozzle 6. At this time, the rotation speed of the wafer 1 is 3000 rpm and the rotation time is five seconds.

Figure 2G:
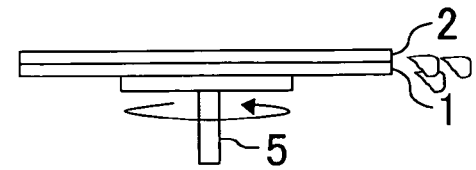

Then, in a drying step ST8 shown in FIG. 1, as illustrated in FIG. 2G, the wafer 1 is rotated at a high speed of, for example, 4000 rpm so that the developer 4 and the rinsing solution 7 are flung off so that the wafer 1 is dried.

A series of the second developer dropping step ST4, the second developing step ST5, the rinsing step ST6 and the rinsing-solution flinging off step ST7 is preferably performed at least twice.

Figure 4:
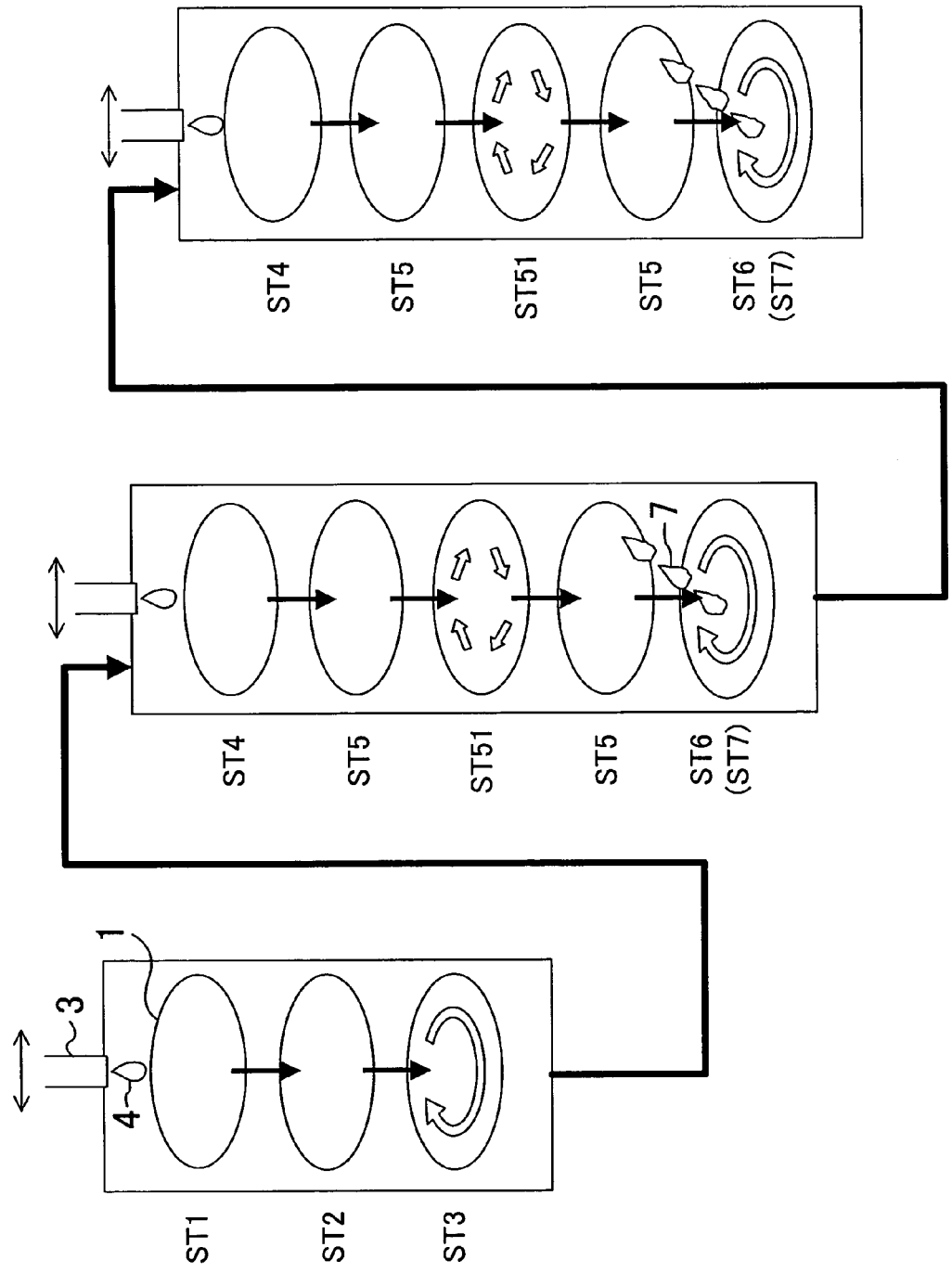
FIG. 4 is a perspective view schematically showing respective process steps of the developing method of the first embodiment.

FIG. 4 is a perspective view showing a process flow of a developing method in which a developing process is separately performed in three steps. In FIG. 4, a shaking step ST51 in which a dropped developer 4 is shaken is added to the second developing step ST5.

Hereinafter, advantages obtained by rotating the wafer 1 at 1000 rpm, which is lower than the rotation speed of 3000 rpm at the rinsing-solution flinging off step ST7, in the developer flinging off step ST3 of the first embodiment will be described with reference to the drawings.

Figure 3B:
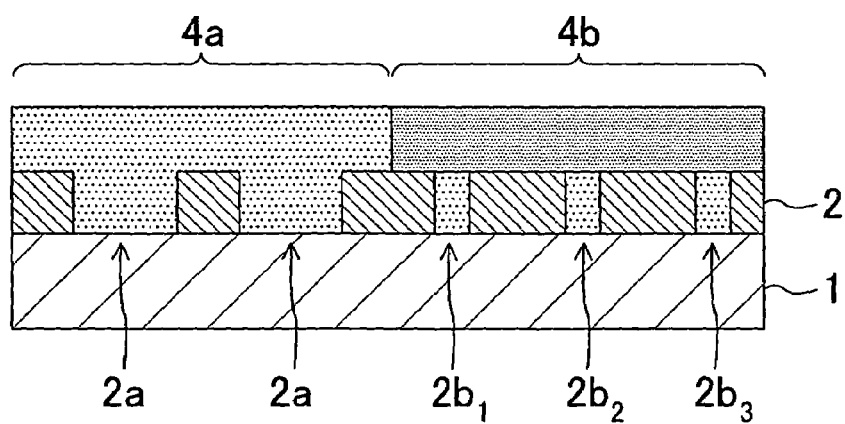

FIG. 3B is a cross-sectional view taken along the line IIIb-IIIb in FIG. 3A and illustrates a cross-sectional structure at a first developing step ST2. As described above, the opening ratio of the first region A is 60% and the opening ratio of the second region B is 3% in the resist film 2 formed on the principal surface of the wafer 1. Since the opening ratio of the resist film 2 is relatively high in the first region A, a developer 4a supplied to the first region A is used to develop the electrode pad regions 2a which are openings. On the other hand, since the opening ratio of the contact hole regions 2b (hereinafter, referred to as contact hole regions $2b_1$, $2b_2$ and $2b_3$ in this order from the first region A) is low, the amount of a developer 4b supplied to the second region B and used is small. As a result, a concentration difference in the developer 4 occurs between the developer 4a supplied to the first region A and the developer 4b supplied to the second region B. That is, the developers 4 supplied to the first region A and the second region B comes to have different properties after development. More specifically, since the opening ratio is high and the development region is large in the first region A of the resist film 2, a large amount of the resist film 2 is dissolved. On the other hand, the opening ratio of the second region B is smaller than that of the first region A, so that the amount of the resist film 2 dissolved with the developer 4b is smaller than that in the first region A. Accordingly, the degree of freshness of the developer 4b is higher than that of the developer 4a.

FIGS. 5A(1), 5B(1) and 5C(1) schematically show distributions of the developer 4a and the developer 4b when flingoff rotation speed of the wafer 1 is set at 2000 rpm, 1500 rpm and 1000 rpm, respectively, in the developer flinging off step ST3. FIGS. 5A(1) and 5B(1) show comparative examples. The case of FIG. 5A(1) is referred to as high-speed rotation and the case of FIG. 5B(1) is referred to as medium-speed rotation. FIG. 5C(1) shows the case of the rotation speed of the present invention, which is referred to as low-speed rotation. In these cases of rotation speeds, the rotation time of the wafer 1 is the same.

As shown in FIG. 5A(1), in the case of high-speed rotation in which the rotation speed of the wafer 1 is 2000 rpm, the developer 4b is flung off from the contact hole regions $2b_1$, $2b_2$ and $2b_3$ in the second region B and the low-concentration developer 4a enters the contact hole regions 2b from the first region A adjacent to the second region B. In addition, at this time, the amount of the developer 4a entering the contact hole region $2b_1$ near the first region A is larger than that of the developer 4a entering the contact hole region $2b_3$ apart from the first region A. In this manner, the amount of the less-fresh developer 4a used for development of the resist film 2 in the first region A and entering the contact hole regions 2b increases in the order of the contact hole regions $2b_1$, $2b_2$ and $2b_3$, as the distance from the wafer 1 decreases. Accordingly, the developers 4a and 4b are mixed in the second region B so that the concentration of the developer 4 varies. This variation in the concentration of the developer 4 occurring in the second region B causes a variation, i.e., the pattern size (i.e., the hole diameter) of the contact hole regions $2b_1$, $2b_2$ and $2b_3$ decreases as the distance from the first region A decreases, as shown in the graph of FIG. 5A(2). Though the contact hole region $2b_3$ apart from the first region A is affected by the developer 4a, the influence of the developer 4a is relatively small.

Next, in the cases of medium-speed rotation in which the rotation speed of the wafer 1 is 1500 rpm shown in FIGS. 5B(1) and 5B(2), as in the case of high-speed rotation, the pattern (i.e., the hole diameter) of the contact hole regions $2b_1$, $2b_2$ and $2b_3$ is also affected to some degree by the developer 4a.

Then, in the case of low-speed rotation in which the rotation speed of the wafer 1 is 1000 rpm shown in FIG. 5C(1), which is the case of the present invention, the developer 4b remains in the pattern of the contact hole regions $2b_1$, $2b_2$ and $2b_3$. This is because the low-speed rotation causes the developer 4b supplied onto the surface of the resist film 2 to be flung off but the developer 4b in the pattern to remain in the contact hole regions 2b.

Specifically, the developer 4a does not enter the contact hole regions $2b_1$, $2b_2$ and $2b_3$ from the first region A, thus preventing mixing of the developer 4a and the developer 4b in the second region B. In this manner, as shown in FIG. 5C(2), it is possible to prevent a variation in hole diameter among the contact hole regions $2b_1$, $2b_2$ and $2b_3$.

In this manner, in the first embodiment, the rotation speed in flinging off the developer 4 is reduced to a degree at which the developer 4a supplied to the first region A does not affect the contact hole regions 2b in the second region B. This rotation speed is 1000 rpm in the first embodiment. It is confirmed that even at the medium speed of 1500 rpm, a variation in hole diameter is suppressed as compared to the high speed of 2000 rpm. To effectively remove the developer 4, the rotation speed of the wafer 1 is preferably as high as possible in general. However, in the first embodiment, the rotation speed of the wafer 1 is set at low on purpose in order to prevent a variation in hole diameter of contact holes. The low-speed rotation in the developer flinging off step ST3 should not be performed at a high speed of, for example, 2500 rpm or more at which the resist film 2 is completely dried. The surface of the resist film 2 needs to be wet with the developer 4. This is because if the surface of the resist film 2 is dried, foreign matters generated during development are attached to the surface of the resist film.

Figure 6:
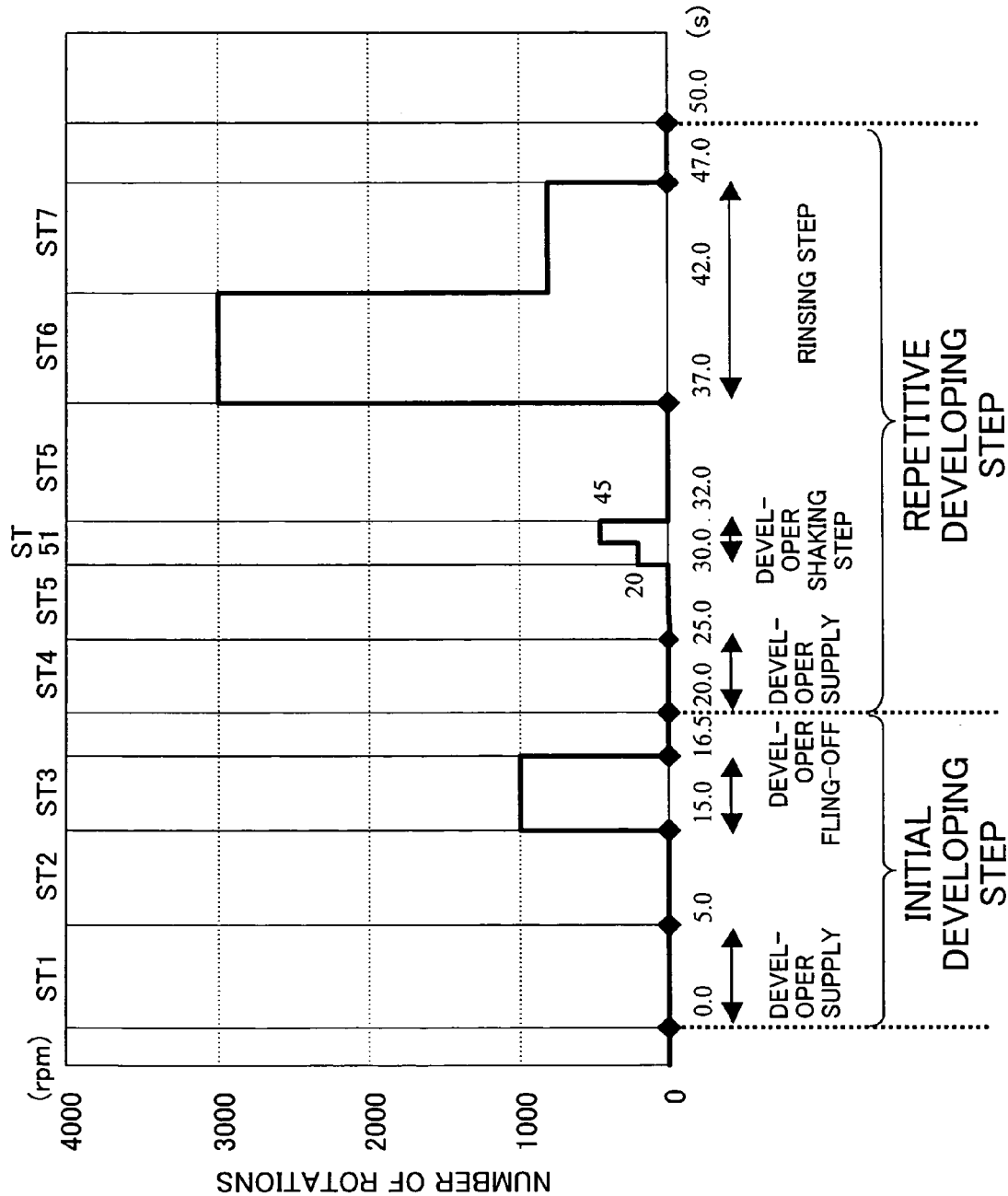
FIG. 6 is a time chart showing the developing method of the first embodiment from the step of supplying a developer onto a resist film subjected to exposure to a rinsing step.

FIG. 6 is a time chart showing a multi-stage developing method according to the first embodiment from the step of supplying a developer onto a resist film subjected to exposure to a rinsing step. In FIG. 6, the abscissa represents time (sec.) and the ordinate represents the rotation speed (rpm) of a wafer. The names of steps correspond to the respective steps shown in FIGS. 1 and 4.

As shown in FIG. 6, first, in a first developer dropping step ST1, a developer discharging nozzle is moved over the surface of a wafer with the wafer kept still, thereby supplying a developer onto a resist film in a paddle state. At this time, the developer is supplied for five seconds.

Next, in a first developing step ST2, the resist film on the wafer is subjected to development with the wafer kept still for 10 seconds.

Then, in a developer flinging off step ST3, the wafer is rotated for 1.5 seconds at a rotation speed of 100 rpm, thereby flinging off and removing the developer from the wafer (from 15 seconds to 16.5 seconds after the start). At this time, as described above, the developer supplied onto the first region A is not mixed into contact hole regions in the second region B because of low-speed rotation. Accordingly, the hole diameter of the contact hole regions is free from the influence of a consumed developer (i.e., a less-fresh developer having a deteriorated resist dissolving property). It should be noted that no rinsing solution is used in this step ST3 as described above.

Thereafter, in a second developer dropping step ST4, a developer discharging nozzle is moved over the wafer with the wafer kept still, thereby supplying a developer onto the resist film in a paddle state. At this time, the developer is supplied for five seconds (from 20 seconds to 25 seconds after the start). The second or subsequent supply of a developer may be performed with the wafer rotated.

Subsequently, in the second developing step ST5, development is performed for five seconds (from 25 seconds to 30 seconds) with the wafer kept still.

Then, in a shaking step ST51, the wafer is shaken. In this step, the rotation speed of the wafer is 20 rpm for the first one second and 45 rpm for the next one second (from 30 seconds to 32 seconds after the start). The shaking step ST51 is performed so as to allow the new developer supplied second to be supplied onto the entire surface of the resist film without fail. Accordingly, the rotation speed of the wafer is low enough to prevent scattering of the developer from the wafer. Further, the wafer is left for five seconds so that the development on the resist film proceeds (from 32 seconds to 37 seconds after the start).

Thereafter, in a rinsing step ST6 and a rinsing-solution flinging off step ST7, the wafer is rotated at 3000 rpm for the first five seconds and the dissolved resist is removed with a rinsing solution (pure water) supplied onto the resist film. For the next five seconds (from 42 seconds to 47 seconds from the start), the rotation speed is reduced to 800 rpm and a rinse process is performed. In this manner, in the rinsing step ST6, the dissolved resist is removed with the wafer being rotated and the rinsing solution being supplied onto the resist film on the wafer. The rotation speed of the wafer at the rinsing step ST6 is 3000 rpm. The rotation at the rinsing step ST6 is performed in order to completely remove the developer, unlike the previous developer flinging off step ST3. Accordingly, to effectively remove the resist, the wafer is preferably rotated at high speed.

Subsequently, after the rinsing step, the wafer is stopped for three seconds (from 47 seconds to the 50 seconds after the start), and the process proceeds to the third developing step, when necessary. In this case, a series of the second developer dropping step ST4 through the rinsing-solution flinging off step ST7 shown in FIG. 6 is repeated.

As described above, in the first embodiment, the rotation speed in flinging off a developer after the first developing step ST2 is set at a half or less, and preferably one third or less, of the rotation speed of the wafer at the rinsing step ST6 for removing the dissolved resist. At this time, the efficiency in flinging off the developer decreases because of the decrease of the rotation speed, but the influence of a developer mixed from the first region A having a high opening ratio into the second region B having a low opening ratio is suppressed. In this manner, an opening pattern of the contact hole regions 2*b* in the second region B having a low opening ratio is formed as designed.

Embodiment 2

Hereinafter, a developing method for a resist according to a second embodiment of the present invention will be described.

The second embodiment is also directed to a resist film 2 shown in FIG. 3A and adjacent design patterns having different opening ratios are exposed on the resist film 2.

The second embodiment is different from the first embodiment in that the rotation speed of the wafer in the developer flinging off step ST3 is set at a half or less of that in the rinsing step in the first embodiment, whereas the rotation speed in a developer flinging off step ST3 is equal to that in a rinsing step but the rotation time is shorter than that in the rinsing step in the second embodiment.

Specifically, in the second embodiment, in the developer flinging off step ST3, the rotation speed and time are set not to dry a resist film 2 on a wafer 1 and the fling-off time of a developer 4 is set such that the rotation speed is 3000 rpm and the rotation time is set at one second, i.e., which is shorter than five seconds in the rinsing step ST6.

In this manner, as in the first embodiment, it is possible to prevent a variation in concentration of a developer 4*b* in a second region B caused when a developer 4*a* supplied to a first region A and having its concentration (freshness) decreased due to dissolution of a resist enters the second region B adjacent to the first region A. As a result, an opening pattern of contact hole regions 2*b* in the second region B having a low opening ratio is formed as designed.

Figure 7:
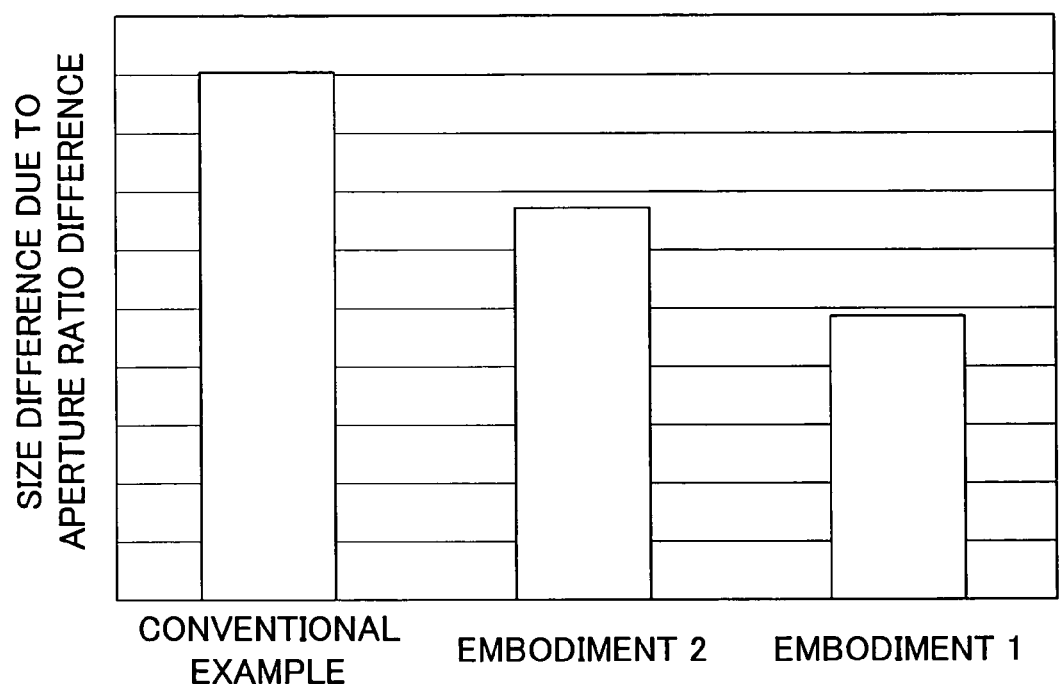
FIG. 7 is graph showing a comparison of the pattern size difference caused by an opening ratio difference between the first and second embodiment of the present invention and a conventional example.

FIG. 7 shows differences in design size (which is the same among the methods) when an opening ratio difference between the first region A and the second region B occurs (i.e., a difference in density variation between patterns is 57%) in the developing method of the first embodiment, the developing method of the second embodiment and a conventional developing method. FIG. 7 shows that the pattern size difference due to the opening ratio difference decreases and the size uniformity depending on a layout is enhanced in the first and second embodiments, as compared to the conventional developing method.

In a multi-stage developing method using still coating with a developer, the fling-off rotation speed of a developer before the rinsing step is reduced in the first embodiment and the fling-off rotation time is reduced in the second embodiment. In this manner, diffusion of the developer from a region having a high opening ratio to a region having a low opening ratio is suppressed, so that a resist pattern of a region having a low opening ratio, e.g., a resist pattern having a small hole diameter for forming contact holes, is formed as designed.

The rotation speed of the wafer in the first fling-off of the developer is reduced in the first embodiment and the rotation time of the wafer in the first fling-off of the developer is reduced in the second embodiment. However, these may be performed in combination at the same time. That is, the rotation speed of the wafer in the first fling-off of the developer may be set at 1000 rpm and the rotation time thereof may be set at one second.

Embodiment 3

Hereinafter, a third embodiment of the present invention will be described with reference to the drawings.

Figure 8A:
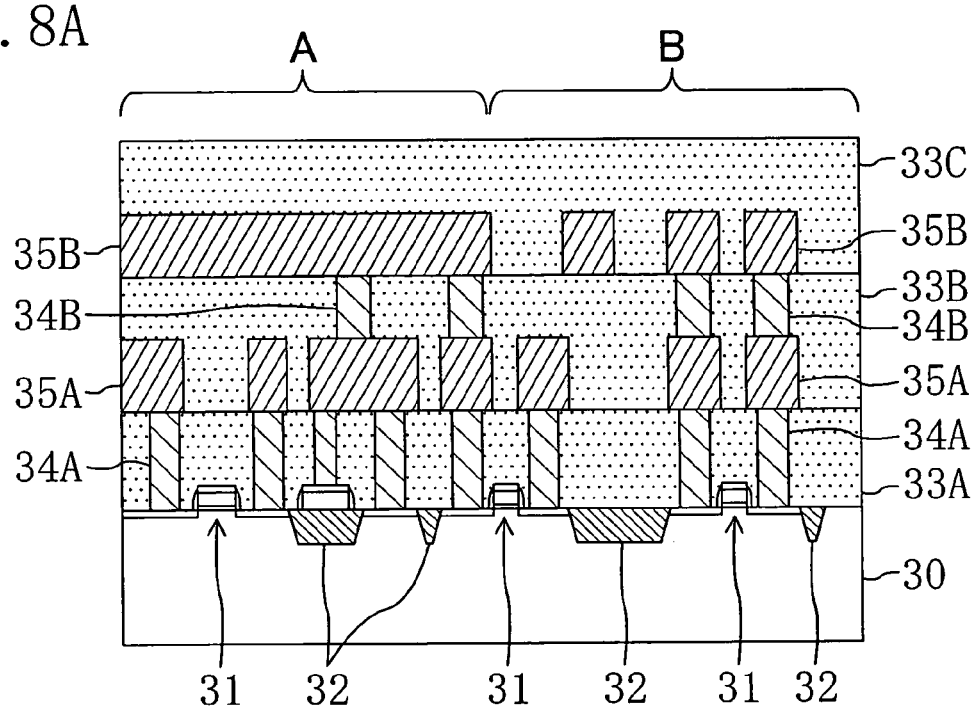
FIGS. 8A and 8B are cross-sectional views showing respective process steps of a method for fabricating a semiconductor device according to a third embodiment of the present invention.
Figure 8B:
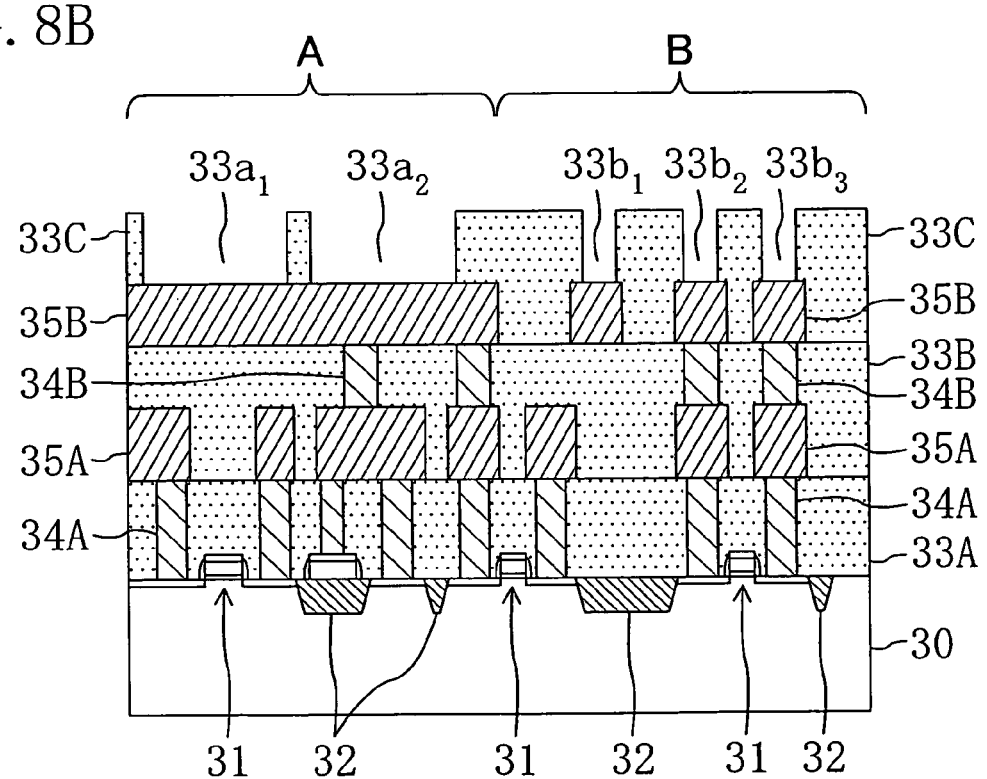
Figure 9:
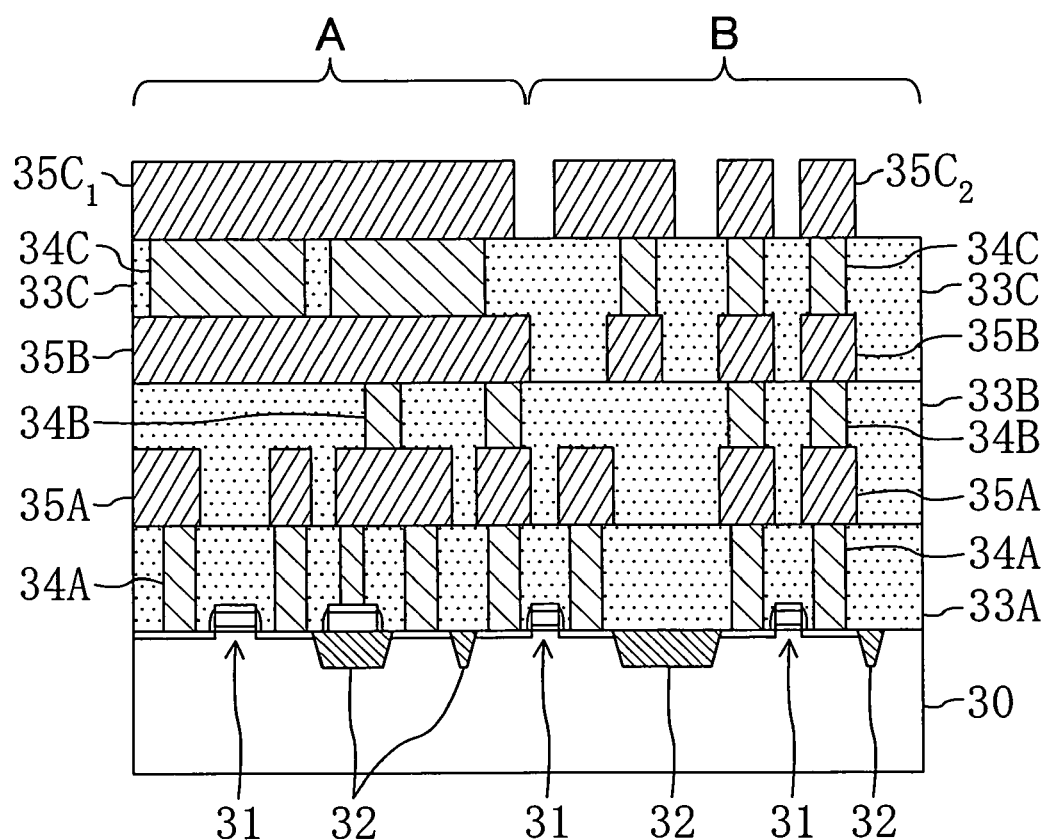
FIG. 9 is a cross-sectional view showing a process step of the method of the third embodiment.

FIGS. 8A and 8B and FIG. 9 illustrate cross-sectional structures of respective process steps of a method for fabricating a semiconductor device according to the third embodiment using the developing method for a resist of the first or second embodiment.

First, as shown in FIG. 8A, a plurality of transistors (field effect transistors) 31 are formed in a wafer (substrate) 30 made of silicon and are isolated from each other by a trench isolation film 32.

A first insulating film 33A made of, for example, silicon oxide and having a planarized upper surface is formed on the wafer 30 to cover the transistors 31. A plurality of first contact plugs 34A are formed in the first insulating film 33A and electrically connected to source/drain regions of the first transistors 31. A plurality of first interconnections 35A containing an aluminum alloy as a main component are formed on the first insulating film 33A to be electrically connected to the first contact plugs 34A.

A second insulating film 33B made of silicon oxide having a planarized upper surface is formed on the first insulating film 33A to cover the first interconnections 35A. A plurality of second contact plugs 34B are formed in the second insulating film 33B and electrically connected to the first interconnections 35A. A plurality of second interconnections 35B containing an aluminum alloy as a main component are formed on the second insulating film 33B and electrically connected to the second contact plugs 34B.

A third insulating film 33C made of silicon oxide having a planarized upper surface is formed on the second insulating film 33B to cover the second interconnections 35B.

The third insulating film 33C is divided into a first region A which is a region where an electrode pad is to be formed and a second region B which is adjacent to the first region A and in which contact holes each having a diameter of about 0.2 μm are to be formed. The opening ratio of the first region A is about 55%, whereas the opening ratio of the second region B is about 3%.

Next, the third insulating film 33C is coated with a resist film (not shown) and design patterns of an electrode pad and contact holes are exposed to light. Thereafter, with the developing method of the first or second embodiment, the resist pattern in which the design patterns have been exposed to light is subjected to development, thereby forming a resist pattern. Subsequently, using the resist pattern as a mask, dry etching is performed, thereby forming openings $33a_1$ and $33a_2$ in the first region A of the third insulating film 33C and openings $33b_1$, $33b_2$ and $33b_3$ in the second region B of the third insulating film 33C as shown in FIG. 8B.

In the third embodiment, the developing method of the first or second embodiment is used for the developing method for the resist film, so that the opening size does not vary among the openings $33b_1$, $33b_2$ and $33b_3$ formed in the second region B of the third insulating film 33C. Accordingly, the openings $33b_1$, $33b_2$ and $33b_3$ formed in the second region B of the third insulating film 33C have the same diameter.

Then as shown in FIG. 9, tungsten is deposited by, for example, a chemical vapor deposition (CVD) process or a sputtering process to fill the openings $33a_1$ and $33a_2$ in the first region A having a relatively large hole diameter in the surface of the third insulating film 33C and the openings $33b_1$, $33b_2$ and $33b_3$ in the second region B having a relatively small hole diameter in the surface of the third insulating film 33C. Subsequently, the upper surface of deposited tungsten is planarized by a chemical mechanical polishing (CMP) process. In this manner, third contact plugs 34C made of tungsten are formed in the openings $33a_1$, $33a_2$, $33b_1$, $33b_2$ and $33b_3$. Thereafter, a metal layer containing an aluminum alloy as a main component is deposited by a sputtering process over the planarized third insulating film 33C. In this manner, a pad electrode $35C_1$ connected to the third contact plugs 34C is obtained in the first region A and third interconnections $35C_2$ connected to the respective third contact plugs 34C are obtained in the second region B.

In this manner, even in a structure of a semiconductor device in which the first region A having a high opening ratio such as a region for an electrode pad and the second region B adjacent to the first region A at a distance of 1 mm or less and having a low opening ratio such as a region for contact holes are both provided, the hole diameter in the second region B having a low opening ratio is allowed to be formed as designed, so that a semiconductor device having a high yield is obtained.

As described above, a developing method according to the present invention and a method for fabricating a semiconductor device using the developing method prevent a variation from occurring in pattern size (i.e., opening size) even when design patterns having different opening ratios are provided. Therefore, the present invention is useful for a developing method for a resist film used in photolithography and a method for fabricating a semiconductor device using the developing method, for example.

What is claimed is:

1. A developing method, comprising the steps of:
   a first developer supplying step of supplying a first developer onto a resist film provided on a semiconductor substrate, made of a resist and having an upper surface on which design patterns including a first opening region having an opening ratio of 20% or more and a second opening region having an opening ratio of 5% or less, the opening ratio being an opening area per unit area, have been exposed;
   a first developing step of causing a development reaction to proceed on the resist film with the supplied first developer;
   a first developer removing step of rotating the semiconductor substrate to fling off and remove the first developer and the resist dissolved in the first developer, after the first developing step;
   a second developer supplying step of supplying a second developer onto the resist film subjected to development, after the first developer removing step;
   a second developing step of causing a development reaction to proceed on the resist film with the supplied second developer;
   a rinsing step of supplying a rinsing solution onto the resist film subjected to development and rotating the semiconductor substrate to wash out the second developer and the resist dissolved in the second developer, after the second developing step; and
   a drying step of drying the semiconductor substrate, wherein:
   in the first developer supplying step, the first developer is supplied with the semiconductor substrate kept still, in the first developing step, the development reaction proceeds with the semiconductor substrate kept still, and the rotation speed of the semiconductor substrate in the first developer removing step is one third or less of the rotation speed of the semiconductor substrate in the rinsing step.

2. The developing method of claim 1, wherein the resist film subjected to development is kept not to be dried between the first developer removing step and the second developer supplying step.

3. The developing method of claim 1, wherein a series of the second developer supplying step, the second developing step and the rinsing step is performed at least twice.

4. The developing method of claim 1, wherein the rotation speed of the semiconductor substrate in the first developer removing step is less than 1000 rpm.

5. The developing method of claim 1, wherein:

the first opening region is an electrode-pad region for forming an electrode pad, and the second opening region is a contact-hole-pattern region for forming a contact hole pattern.

6. The method of claim 5, wherein a distance between the electrode-pad region and the contact-hole-pattern region is 1 mm or less.

7. A developing method, comprising the steps of:

a first developer supplying step of supplying a first developer onto a resist film provided on a semiconductor substrate, made of a resist and having an upper surface on which design patterns including a first opening region having an opening ratio of 20% or more and a second opening region having an opening ratio of 5% or less, the opening ratio being an opening area per unit area, have been exposed;

a first developing step of causing a development reaction to proceed on the resist film with the supplied first developer;

a first developer removing step of rotating the semiconductor substrate to fling off and remove the first developer and the resist dissolved in the first developer, after the first developing step;

a second developer supplying step of supplying a second developer onto the resist film subjected to development, after the first developer removing step;

a second developing step of causing a development reaction to proceed on the resist film with the supplied second developer;

a rinsing step of supplying a rinsing solution onto the resist film subjected to development and rotating the semiconductor substrate to wash out the second developer and the resist dissolved in the second developer, after the second developing step; and a drying step of drying the semiconductor substrate, wherein:

in the first developer supplying step, the first developer is supplied with the semiconductor substrate kept still, in the first developing step, the development reaction proceeds with the semiconductor substrate kept still, the rotation time of the semiconductor substrate in the first developer removing step is shorter than the rotation time of the semiconductor substrate in the rinsing step, and the rotation speed of the semiconductor substrate in the first developer removing step is one third or less of the rotation speed of the semiconductor substrate in the rinsing step.

8. The developing method of claim 7, wherein the resist film subjected to development is kept not to be dried between the first developer removing step and the second developer supplying step.

9. The developing method of claim 7, wherein a series of the second developer supplying step, the second developing step and the rinsing step is performed at least twice.

10. The developing method of claim 7, wherein the rotation speed of the semiconductor substrate in the first developer removing step is less than 1000 rpm.

11. The developing method of claim 7, wherein:

the first opening region is an electrode-pad region for forming an electrode pad, and the second opening region is a contact-hole-pattern region for forming a contact hole pattern.

12. The method of claim 11, wherein a distance between the electrode-pad region and the contact-hole-pattern region is 1 mm or less.

* * * * *